United States Patent
Lin et al.

(10) Patent No.: US 10,305,427 B2
(45) Date of Patent: May 28, 2019

(54) DIGITAL MODULATING DEVICE, FREQUENCY DOUBLING MODULATOR THEREOF AND FREQUENCY DOUBLER

(71) Applicant: National Chi Nan University, Puli, Nantou (TW)

(72) Inventors: Yo-Sheng Lin, Nantou (TW); Wei-Hsiang Tseng, Nantou (TW)

(73) Assignee: NATIONAL CHI NAN UNIVERSITY, Puli, Nantou (TW)

(*) Notice: Subject to any disclaimer, the term of this patent is extended or adjusted under 35 U.S.C. 154(b) by 0 days.

(21) Appl. No.: 15/648,896

(22) Filed: Jul. 13, 2017

(65) Prior Publication Data
US 2018/0254743 A1    Sep. 6, 2018

(30) Foreign Application Priority Data
Mar. 3, 2017 (TW) .............................. 106106943 A

(51) Int. Cl.
H03B 19/14     (2006.01)
H03B 5/12      (2006.01)

(52) U.S. Cl.
CPC ........... *H03B 19/14* (2013.01); *H03B 5/1212* (2013.01); *H03B 5/1228* (2013.01); *H03B 5/1243* (2013.01); *H03B 2200/004* (2013.01); *H03B 2200/007* (2013.01); *H03B 2200/0092* (2013.01); *H03B 2202/05* (2013.01)

(58) Field of Classification Search
CPC ........ H03B 19/03; H03B 19/06; H03B 19/08; H03B 19/10; H03B 19/14
See application file for complete search history.

(56) References Cited

U.S. PATENT DOCUMENTS

| | | | | |
|---|---|---|---|---|
| 5,194,820 A * | 3/1993 | Besson | ................. | H03B 19/14 327/122 |
| 5,392,014 A * | 2/1995 | Nishida | ................. | H03B 19/14 327/119 |
| 5,884,143 A * | 3/1999 | Wolkstein | ............... | H03F 1/526 330/107 |
| 6,124,742 A * | 9/2000 | Cook | .................... | H03B 19/14 327/116 |
| 7,546,095 B2 * | 6/2009 | Arimura | ................ | H03B 19/14 327/116 |
| 8,786,330 B1 * | 7/2014 | Chakraborty | .......... | H03B 19/14 327/119 |
| 9,742,352 B2 * | 8/2017 | Lin | ...................... | H03B 5/1228 |
| 2002/0118050 A1 * | 8/2002 | Grondahl | ............... | H03B 19/14 327/122 |

(Continued)

*Primary Examiner* — Thomas J. Hiltunen
(74) *Attorney, Agent, or Firm* — Merchant & Gould P.C.

(57) ABSTRACT

A digital modulating device includes an oscillator that generates an oscillation signal, and a frequency doubling modulator that includes: a single-ended to differential converter converting the oscillation signal into two periodic signals; two inductors respectively receiving the periodic signals and respectively providing two input signals; a switching circuit; and two amplifier circuits. When the switching circuit operates in a first state, the amplifier circuits respectively amplify the input signals to respectively generate two amplified signals that are combined into a combined signal at a common node thereof. When the switching circuit operates in a second state, the amplifier circuits do not perform amplification.

11 Claims, 6 Drawing Sheets

(56) References Cited

U.S. PATENT DOCUMENTS

| | | | |
|---|---|---|---|
| 2011/0095792 A1* | 4/2011 | Bao | H03B 19/14 327/119 |
| 2012/0062287 A1* | 3/2012 | Jang | H03B 5/1228 327/156 |
| 2013/0187714 A1* | 7/2013 | Ben-Yishay | H03B 19/14 330/252 |
| 2013/0194100 A1* | 8/2013 | Granhed | A63B 29/021 340/584 |
| 2014/0065985 A1* | 3/2014 | Weissman | H04B 1/40 455/86 |

* cited by examiner

DIGITAL MODULATING DEVICE, FREQUENCY DOUBLING MODULATOR THEREOF AND FREQUENCY DOUBLER

CROSS-REFERENCE TO RELATED APPLICATION

This application claims priority of Taiwanese Patent Application No. 106106943, filed on Mar. 3, 2017.

FIELD

The disclosure relates to digital modulation and frequency doubling, and more particularly to a digital modulating device, a frequency doubling modulator thereof and a frequency doubler.

BACKGROUND

A push-push voltage-controlled oscillator (VCO) generates a fundamental oscillation signal, and a second harmonic oscillation signal that has a frequency which is twice a frequency of the fundamental oscillation signal. A conventional frequency doubler may be coupled to the push-push VCO for generating, based on the second harmonic oscillation signal, a fourth harmonic oscillation signal that has a frequency which is twice the frequency of the second harmonic oscillation signal. However, when operating in rather high frequency, the conventional frequency doubler has rather high signal attenuation, which renders the fourth harmonic oscillation signal too weak to be used.

SUMMARY

Therefore, an object of the disclosure is to provide a digital modulating device, a frequency doubling modulator thereof and a frequency doubler that can alleviate the drawbacks of the prior art.

According to an aspect of the disclosure, the digital modulating device includes an oscillator and a frequency doubling modulator. The oscillator generates an oscillation signal. The frequency doubling modulator includes a single-ended to differential converter, a first inductor, a second inductor, a switching circuit, a first amplifier circuit and a second amplifier circuit. The single-ended to differential converter is coupled to the oscillator for receiving the oscillation signal therefrom, and converts the oscillation signal into a differential periodic signal pair that includes a first periodic signal and a second periodic signal. The first inductor has a first terminal that is coupled to the single-ended to differential converter for receiving the first periodic signal therefrom, and a second terminal that provides a first input signal. The second inductor has a first terminal that is coupled to the single-ended to differential converter for receiving the second periodic signal therefrom, and a second terminal that provides a second input signal. The switching circuit is used to receive a digital message signal, and is operable between a first state and a second state based on the digital message signal. The first amplifier circuit is coupled to the second terminal of the first inductor for receiving the first input signal therefrom, and is coupled further to the switching circuit. The second amplifier circuit is coupled to the second terminal of the second inductor for receiving the second input signal therefrom, and is coupled further to the switching circuit and the first amplifier circuit. When the switching circuit operates in the first state, the first amplifier circuit amplifies the first input signal to generate a first amplified signal, the second amplifier circuit amplifies the second input signal to generate a second amplified signal, and the first and second amplified signals are combined at a common node of the first and second amplifier circuits into a combined signal that has a frequency which is twice a frequency of the oscillation signal. When the switching circuit operates in the second state, each of the first and second amplifier circuits does not perform amplification.

According to another aspect of the disclosure, the frequency doubling modulator includes a first inductor, a second inductor, a switching circuit, a first amplifier circuit and a second amplifier circuit. The first inductor has a first terminal that receives a first periodic signal, and a second terminal that provides a first input signal. The second inductor has a first terminal that receives a second periodic signal, and a second terminal that provides a second input signal. The first and second periodic signals cooperatively constitute a differential periodic signal pair. The switching circuit is used to receive a digital message signal, and is operable between a first state and a second state based on the digital message signal. The first amplifier circuit is coupled to the second terminal of the first inductor for receiving the first input signal therefrom, and is coupled further to the switching circuit. The second amplifier circuit is coupled to the second terminal of the second inductor for receiving the second input signal therefrom, and is coupled further to the switching circuit and the first amplifier circuit. When the switching circuit operates in the first state, the first amplifier circuit amplifies the first input signal to generate a first amplified signal, the second amplifier circuit amplifies the second input signal to generate a second amplified signal, and the first and second amplified signals are combined at a common node of the first and second amplifier circuits into a combined signal that has a frequency which is twice a frequency of the differential periodic signal pair. When the switching circuit operates in the second state, each of the first and second amplifier circuits does not perform amplification.

According to yet another aspect of the disclosure, the frequency doubler includes a first inductor, a second inductor, a first amplifier circuit and a second amplifier circuit. The first inductor has a first terminal that receives a first periodic signal, and a second terminal that provides a first input signal. The second inductor has a first terminal that receives a second periodic signal, and a second terminal that provides a second input signal. The first and second periodic signals cooperatively constitute a differential periodic signal pair. The first amplifier circuit is coupled to the second terminal of the first inductor for receiving the first input signal therefrom, and amplifies the first input signal to generate a first amplified signal. The second amplifier circuit is coupled to the second terminal of the second inductor for receiving the second input signal therefrom, is coupled further to the first amplifier circuit, and amplifies the second input signal to generate a second amplified signal. The first and second amplified signals are combined at a common node of the first and second amplifier circuits into a combined signal that has a frequency which is twice a frequency of the differential periodic signal pair. The first amplifier circuit includes a first transistor, a third inductor, a first capacitor, a fourth inductor, a second transistor, a fifth inductor, a second capacitor, a sixth inductor, a third transistor, a fourth transistor, a third capacitor, a fourth capacitor and a resistor. The first transistor has a first terminal, a second terminal that is grounded, and a control terminal that is coupled to the second terminal of the first inductor for receiving the first input signal therefrom. The third inductor has a first terminal that is used to receive a first supply voltage, and a second terminal that is coupled to the first terminal of the first transistor. The first capacitor has a first terminal that is coupled to the first terminal of the first transistor, and a second terminal. The fourth inductor has a first terminal that is coupled to the second terminal of the first capacitor, and a second terminal. The second transistor has a first terminal, a second terminal that is grounded, and a control terminal that is coupled to the second terminal of the fourth inductor. The fifth inductor has a first terminal that is used to receive a second supply voltage, and a second terminal that is coupled to the first terminal of the second transistor. The second capacitor has a first terminal that is coupled to the first terminal of the second transistor, and a second terminal. The sixth inductor has a first terminal that is coupled to the second terminal of the second capacitor, and a second terminal. The third transistor has a first terminal, a second terminal, and a control terminal that is coupled to the second terminal of the sixth inductor. The fourth transistor has a first terminal that is coupled to the common node of the first and second amplifier circuits and that provides the first amplified signal, a second terminal that is coupled to the first terminal of the third transistor, and a control terminal. The third capacitor is coupled between the control terminal of the fourth transistor and ground. The fourth capacitor and the resistor are coupled in parallel between the second terminal of the third transistor and ground.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
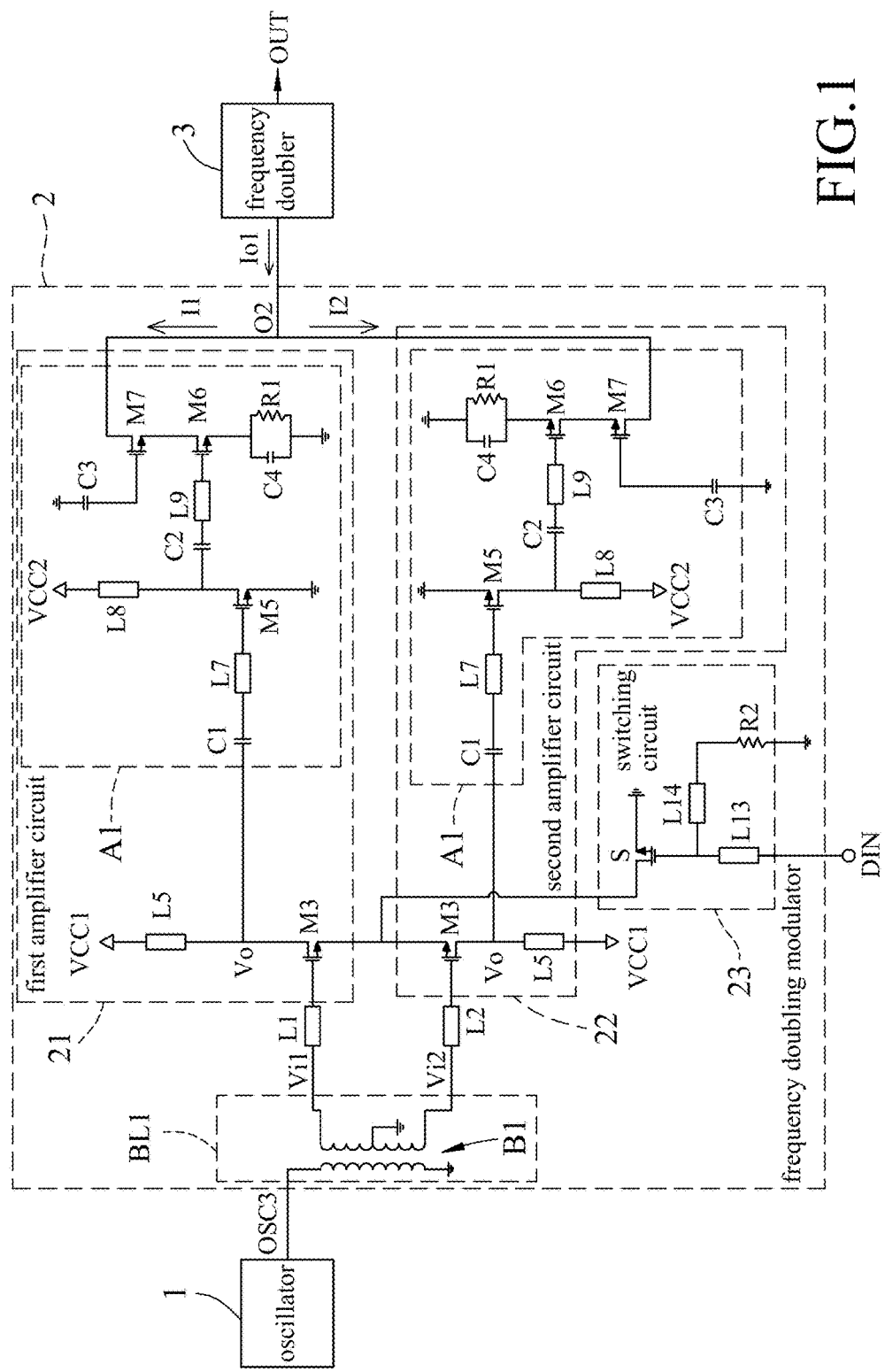
FIG. 1 is a circuit block diagram illustrating an embodiment of a digital modulating device according to the disclosure.

Referring to FIG. 1, an embodiment of a digital modulating device according to the disclosure includes an oscillator 1, a frequency doubling modulator 2 and a frequency doubler 3.

Figure 2:
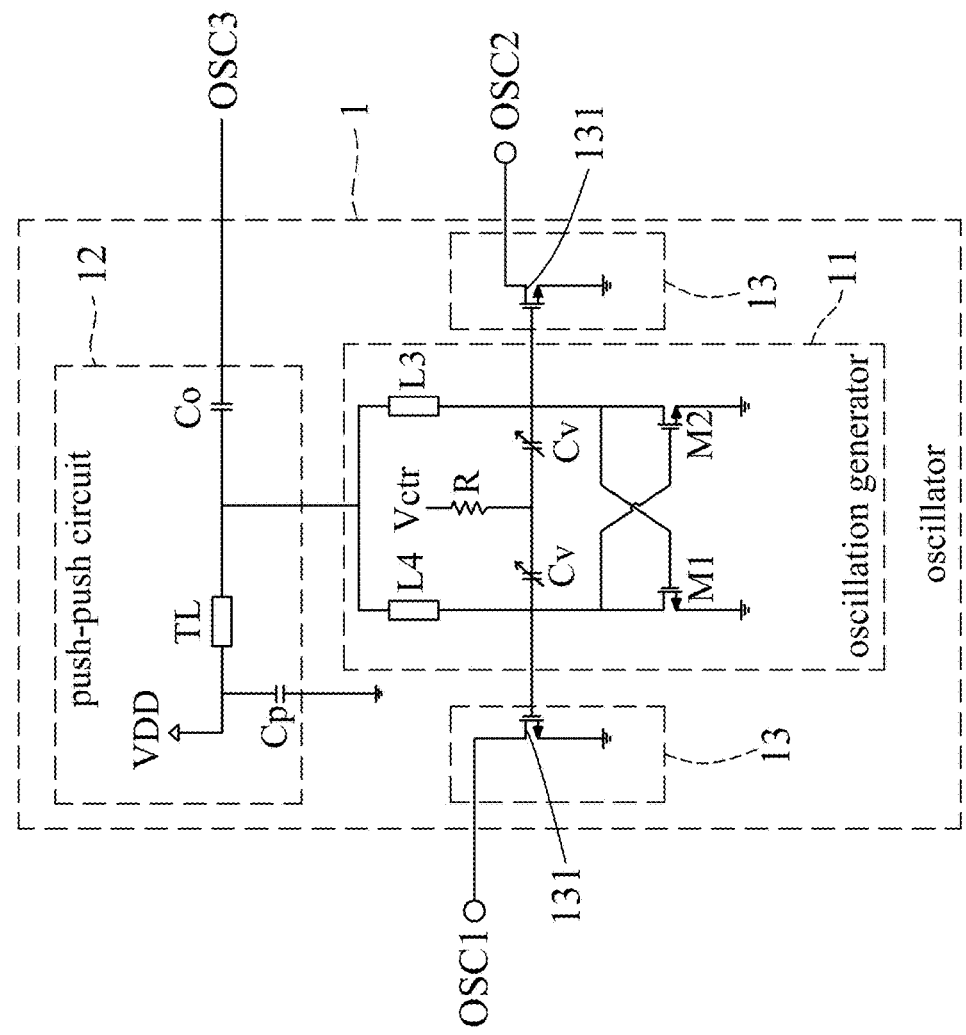
FIG. 2 is a circuit diagram illustrating an oscillator of the embodiment.

Referring to FIG. 2, the oscillator 1 generates at least one oscillation signal. In this embodiment, the oscillator 1 is a push-push voltage-controlled oscillator, and includes an oscillation generator 11, two buffers 13 and a push-push circuit 12.

The oscillation generator 11 is used to receive a control voltage (Vctr), and generates a differential fundamental signal pair and a multi-harmonic signal based on the control voltage (Vctr). The differential fundamental signal pair includes a first fundamental signal and a second fundamental signal, and has a fundamental frequency of f0 which varies according to the control voltage (Vctr). The multi-harmonic signal includes a plurality of harmonics, each having a frequency that is a positive integer multiple of the fundamental frequency of f0. In other words, the multi-harmonic signal has frequencies of f0, 2×f0, 3×f0, 4×f0, etc.

In this embodiment, the oscillation generator 11 includes two transistors (M1, M2), a resistor (R), two varactors (Cv) and two inductors (L3, L4). The transistor (M1) (e.g., an N-type metal oxide semiconductor field effect transistor (nMOSFET)) has a first terminal (e.g., a drain terminal), a second terminal (e.g., a source terminal) that is grounded, and a control terminal (e.g., a gate terminal). The transistor (M2) (e.g., an nMOSFET) has a first terminal (e.g., a drain terminal) that is coupled to the control terminal of the transistor (M1), a second terminal (e.g., a source terminal) that is grounded, and a control terminal (e.g., a gate terminal) that is coupled to the first terminal of the transistor (M1). The resistor (R) has a first terminal that is used to receive the control voltage (Vctr), and a second terminal. Each varactor (Cv) has a first terminal that is coupled to the second terminal of the resistor (R), and a second terminal that is coupled to the first terminal of a respective transistor (M1, M2). Each varactor (Cv) has a capacitance that varies according to the control voltage (Vctr). The inductor (L4) has a first terminal, and a second terminal that is coupled to the first terminal of the transistor (M1). The inductor (L3) is coupled between the first terminal of the inductor (L4) and the first terminal of the transistor (M2). The first fundamental signal is provided at the first terminal of the transistor (M1). The second fundamental signal is provided at the first terminal of the transistor (M2). The multi-harmonic signal is provided at the first terminal of the inductor (L4). The control voltage (Vctr) may be adjusted to change the capacitances of the varactors (Cv), thereby adjusting the fundamental frequency of f0.

Each buffer 13 is coupled to the first terminal of a respective transistor (M1, M2) for receiving a respective one of the first and second fundamental signals therefrom. Each buffer 13 buffers the respective one of the first and second fundamental signals to generate a respective one of a first oscillation signal (OSC1) and a second oscillation signal (OSC2). The first and second oscillation signals (OSC1, OSC2) cooperatively constitute a differential oscillation signal pair having the fundamental frequency of f0.

In this embodiment, each buffer 13 includes a transistor 131. The transistor 131 (e.g., an nMOSFET) has a first terminal (e.g., a drain terminal) that provides the respective one of the first and second oscillation signals (OSC1, OSC2), a second terminal (e.g., a source terminal) that is grounded, and a control signal (e.g., a gate terminal) that is coupled to the first terminal of the respective transistor (M1, M2) for receiving the respective one of the first and second fundamental signals therefrom.

The push-push circuit 12 is coupled to the first terminal of the inductor (L4) for receiving the multi-harmonic signal therefrom, and filters the multi-harmonic signal to generate a third oscillation signal (OSC3) having a second harmonic frequency which is twice the fundamental frequency (i.e., the second harmonic frequency equals 2×f0).

In this embodiment, the push-push circuit 12 includes a transmission line (TL) and two capacitors (Cp, Co). The transmission line (TL) has a first terminal that is used to receive a supply voltage (VDD), and a second terminal that is coupled to the first terminal of the inductor (L4) for receiving the multi-harmonic signal therefrom. The transmission line (TL) has a length that substantially equals a quarter of a wavelength which corresponds to the second harmonic frequency of 2×f0 (i.e., $[(3\times10^8)/(2\times f0)]\times(\frac{1}{4})$ meter). The capacitor (Cp) is coupled between the first terminal of the transmission line (TL) and ground. The capacitor (Co) has a first terminal that is coupled to the second terminal of the transmission line (TL), and a second terminal that provides the third oscillation signal (OSC3).

It should be noted that the transmission line (TL) may be configured as a spiral to reduce space occupancy. In addition, since the push-push circuit 12 includes a relatively small number of elements and does not include any transistor that consumes direct current (DC) power, it occupies a relatively small area and has relatively low power consumption.

Referring back to FIG. 1, the frequency doubling modulator 2 includes a first single-ended to differential converter (BL1), a first inductor (L1), a second inductor (L2), a switching circuit 23, a first amplifier circuit 21 and a second amplifier circuit 22.

The first single-ended to differential converter (BL1) is coupled to the second terminal of the capacitor (Co) (see FIG. 2) for receiving the third oscillation signal (OSC3) therefrom, and converts the third oscillation signal (OSC3) into a first differential periodic signal pair that includes a first periodic signal (Vi1) and a second periodic signal (Vi2) and that has the second harmonic frequency of 2×f0.

The first inductor (L1) has a first terminal that is coupled to the first single-ended to differential converter (BL1) for receiving the first periodic signal (Vi1) therefrom, and a second terminal that provides a first input signal.

The second inductor (L2) has a first terminal that is coupled to the first single-ended to differential converter (BL1) for receiving the second periodic signal (Vi2) therefrom, and a second terminal that provides a second input signal.

The switching circuit 23 is used to receive a digital message signal (DIN), and is operable between a first state and a second state based on the digital message signal (DIN).

The first amplifier circuit 21 is coupled to the second terminal of the first inductor (L1) for receiving the first input signal therefrom, and is coupled further to the switching circuit 23.

The second amplifier circuit 22 is coupled to the second terminal of the second inductor (L2) for receiving the second input signal therefrom, and is coupled further to the switching circuit 23 and the first amplifier circuit 21.

When the switching circuit 23 operates in the first state, the first amplifier circuit 21 amplifies the first input signal to generate a first amplified signal (I1), the second amplifier circuit 22 amplifies the second input signal to generate a second amplified signal (I2), and the first and second amplified signals (I1, I2) are combined at a common node (O2) of the first and second amplifier circuits 21, 22 into a first combined signal (Io1) having a fourth harmonic frequency that is twice the second harmonic frequency (i.e., the fourth harmonic frequency equals 4×f0).

When the switching circuit 23 operates in the second state, each of the first and second amplifier circuits 21, 22 does not perform amplification.

Figure 5:
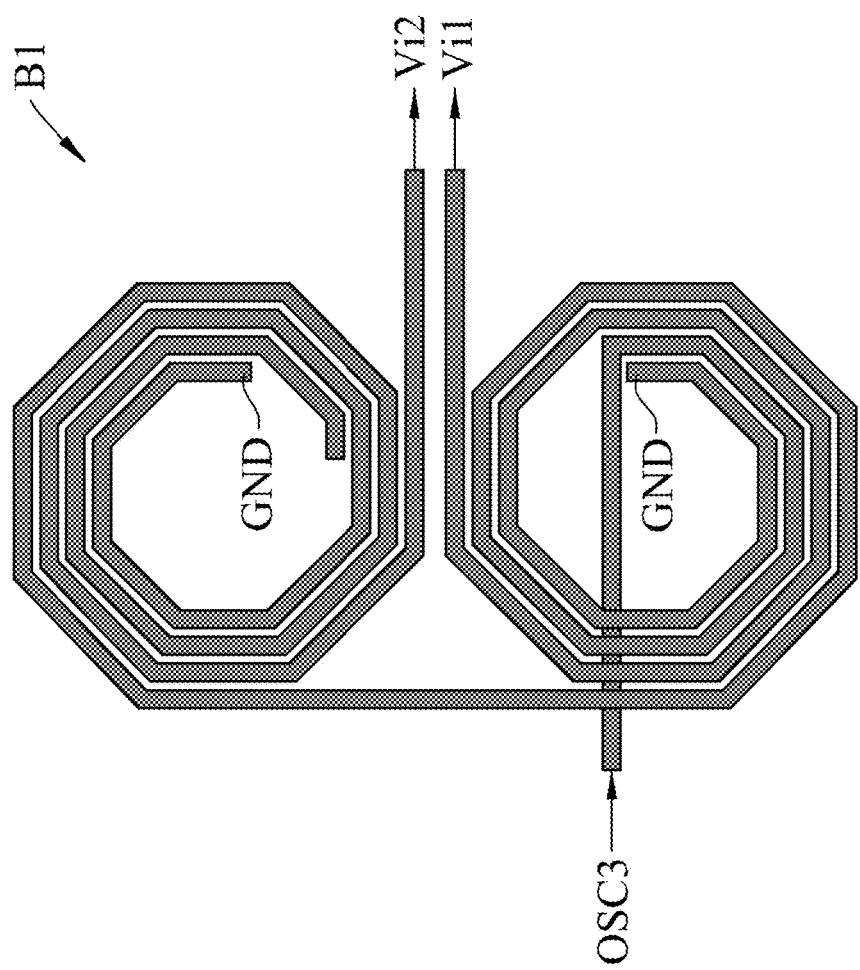
FIG. 5 is a layout diagram illustrating a balun of the embodiment.

In this embodiment, the first single-ended to differential converter (BL1) includes a balun (B1) that is configured as two pairs of interwound octangular spirals as shown in FIG. 5.

In this embodiment, the switching circuit 23 includes two inductors (L13, L14), a resistor (R2) and a switch (S). The inductor (L13) has a first terminal that is used to receive the digital message signal (DIN), and a second terminal. The inductor (L14) has a first terminal that is coupled to the second terminal of the inductor (L13), and a second terminal. The resistor (R2) is coupled between the second terminal of the inductor (L14) and ground. The switch (S) (e.g., an nMOSFET) has a first terminal (e.g., a drain terminal), a second terminal (e.g., a source terminal) that is grounded, and a control terminal (e.g., a gate terminal) that is coupled to the second terminal of the inductor (L13). The digital message signal (DIN) is switchable between a logic high level and a logic low level. When the digital message signal (DIN) is at the logic high level, the switching circuit 23 operates in the first state where the switch (S) conducts. When the digital message signal (DIN) is at the logic low level, the switching circuit 23 operates in the second state where the switch (S) does not conduct.

In this embodiment, each of the first and second amplifier circuits 21, 22 includes a transistor (M3), an inductor (L5) and an amplifier (A1). The transistor (M3) (e.g., an nMOSFET) has a first terminal (e.g., a drain terminal), a second terminal (e.g., a source terminal) that is coupled to the first terminal of the switch (S), and a control terminal (e.g., a gate terminal) that is coupled to the second terminal of a corresponding one of the first and second inductors (L1, L2) for receiving the corresponding one of the first and second input signals therefrom. The inductor (L5) has a first terminal that is used to receive a supply voltage (VCC1), and a second terminal that is coupled to the first terminal of the transistor (M3). An intermediate signal (Vo) is provided at the first terminal of the transistor (M3) when the switch (S) conducts, and is not provided when the switch (S) does not conduct. The amplifier (A1) is coupled to the first terminal of the transistor (M3) for receiving the intermediate signal (Vo) therefrom, is coupled further to the common node (O2), and amplifies the intermediate signal (Vo) to generate the corresponding one of the first and second amplified signals (I1, I2) at the common node (O2).

In this embodiment, for each of the first and second amplifier circuits 21, 22, the amplifier (A1) includes four capacitors (C1-C4), three inductors (L7-L9), three transistors (M5-M7) and a resistor (R1). The capacitor (C1) has a first terminal that is coupled to the first terminal of the transistor (M3) for receiving the intermediate signal (Vo) therefrom, and a second terminal. The inductor (L7) has a first terminal that is coupled to the second terminal of the capacitor (C1), and a second terminal. The transistor (M5) (e.g., an nMOSFET) has a first terminal (e.g., a drain terminal), a second terminal (e.g., a source terminal) that is grounded, and a control terminal (e.g., a gate terminal) that is coupled to the second terminal of the inductor (L7). The inductor (L8) has a first terminal that is used to receive a supply voltage (VCC2), and a second terminal that is coupled to the first terminal of the transistor (M5). The capacitor (C2) has a first terminal that is coupled to the first terminal of the transistor (M5), and a second terminal. The inductor (L9) has a first terminal that is coupled to the second terminal of the capacitor (C2), and a second terminal. The transistor (M6) (e.g., an nMOSFET) has a first terminal (e.g., a drain terminal), a second terminal (e.g., a source terminal), and a control terminal (e.g., a gate terminal) that is coupled to the second terminal of the inductor (L9). The transistor (M7) (e.g., an nMOSFET) has a first terminal (e.g., a drain terminal) that is coupled to the common node (O2) and that provides the corresponding one of the first and second amplified signals (I1, I2), a second terminal (e.g., a source terminal) that is coupled to the first terminal of the transistor (M6), and a control terminal (e.g., agate terminal). The capacitor (C3) is coupled between the control terminal of the transistor (M7) and ground. The capacitor (C4) and the resistor (R1) are coupled in parallel between the second terminal of the transistor (M6) and ground.

Figure 3:
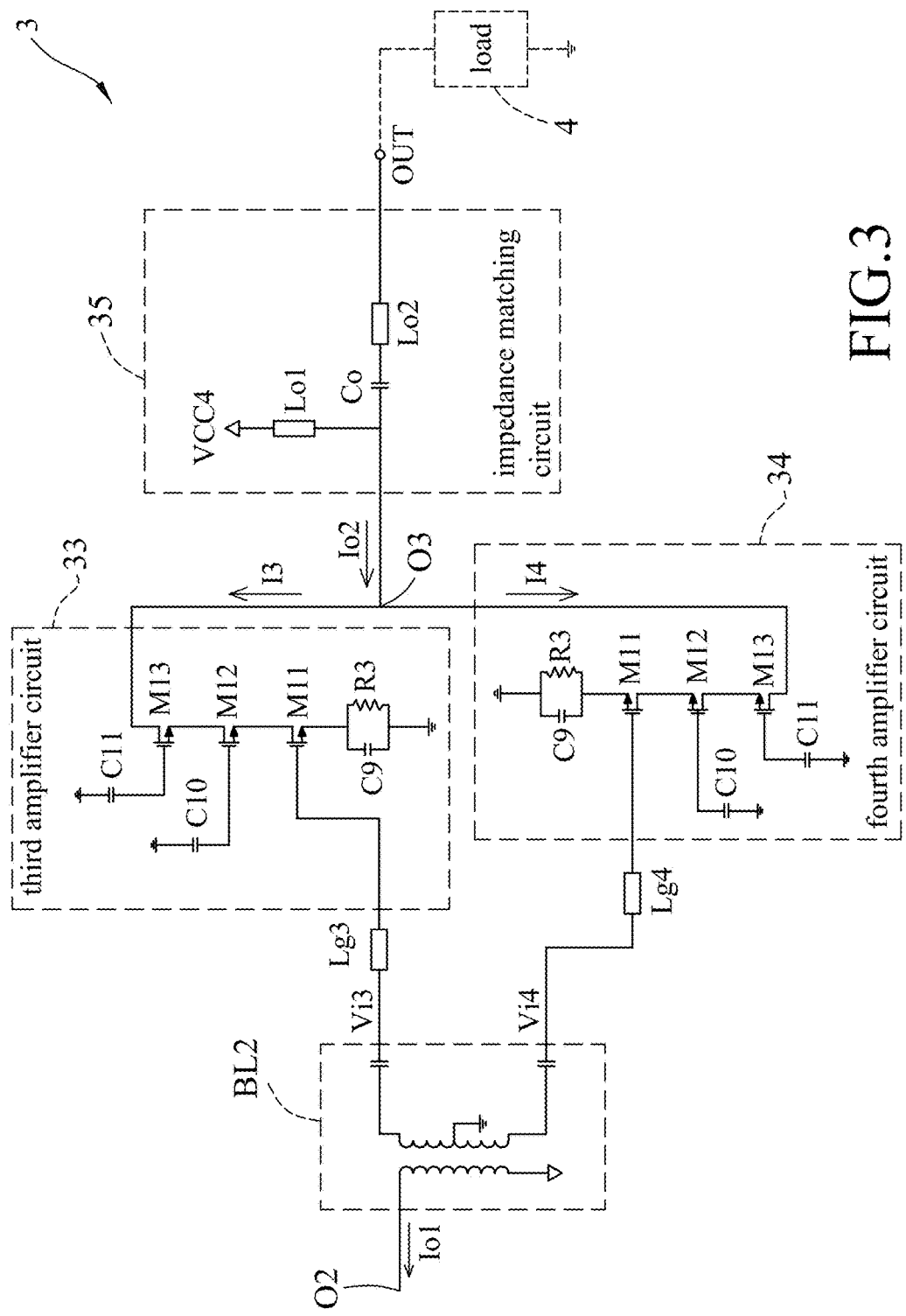
FIG. 3 is a circuit diagram illustrating a frequency doubler of the embodiment.

Referring to FIG. 3, the frequency doubler 3 is coupled to the common node (O2) for receiving the first combined signal (Io1) therefrom, and generates, based on the first combined signal (Io1), an output signal (OUT) having an eighth harmonic frequency that is twice the fourth harmonic frequency (i.e., the eighth harmonic frequency equals 8×f0).

In this embodiment, the frequency doubler 3 includes a second single-ended to differential converter (BL2), a third inductor (Lg3), a fourth inductor (Lg4), a third amplifier circuit 33, a fourth amplifier circuit 34 and an impedance matching circuit 35.

The second single-ended to differential converter (BL2) is coupled to the common node (O2) for receiving the first combined signal (Io1) therefrom, and converts the first combined signal (Io1) into a second differential periodic signal pair that includes a third periodic signal (Vi3) and a fourth periodic signal (Vi4) and that has the fourth harmonic frequency of 4×f0.

The third inductor (Lg3) has a first terminal that is coupled to the second single-ended to differential converter (BL2) for receiving the third periodic signal (Vi3) therefrom, and a second terminal that provides a third input signal.

The fourth inductor (Lg4) has a first terminal that is coupled to the second single-ended to differential converter (BL2) for receiving the fourth periodic signal (Vi4) therefrom, and a second terminal that provides a fourth input signal.

The third amplifier circuit 33 is coupled to the second terminal of the third inductor (Lg3) for receiving the third input signal therefrom, and amplifies the third input signal to generate a third amplified signal (I3).

The fourth amplifier circuit 34 is coupled to the second terminal of the fourth inductor (Lg4) for receiving the fourth input signal therefrom, is coupled further to the third amplifier circuit 33, and amplifies the fourth input signal to generate a fourth amplified signal (I4).

The third and fourth amplified signals (I3, I4) are combined at a common node (O3) of the third and fourth amplifier circuits 33, 34 into a second combined signal (Io2) having the eighth harmonic frequency.

The impedance matching circuit 35 is coupled to the common node (O3) for receiving the second combined signal (Io2) therefrom, and is used to be coupled further to a load 4. The impedance matching circuit 35 provides the output signal (OUT) for the load 4 based on the second combined signal (Io2), and determines an output impedance seen into the frequency doubler 3. The impedance matching circuit 35 is configured such that the output impedance seen into the frequency doubler 3 matches an input impedance seen into the load 4.

In this embodiment, each of the third and fourth amplifier circuits 33, 34 includes three transistors (M11-M13), three capacitors (C9-C11) and a resistor (R3). The transistor (M11) (e.g., an nMOSFET) has a first terminal (e.g., a drain terminal), a second terminal (e.g., a source terminal), and a control terminal (e.g., a gate terminal) that is coupled to the second terminal of a corresponding one of the third and fourth inductors (Lg3, Lg4) for receiving a corresponding one of the third and fourth input signals therefrom. The transistor (M12) (e.g., an nMOSFET) has a first terminal (e.g., a drain terminal), a second terminal (e.g., a source terminal) that is coupled to the first terminal of the transistor (M11), and a control terminal (e.g., a gate terminal). The transistor (M13) (e.g., an nMOSFET) has a first terminal (e.g., a drain terminal) that is coupled to the common node (O3) and that provides a corresponding one of the third and fourth amplified signals (I3, I4), a second terminal (e.g., a source terminal) that is coupled to the first terminal of the transistor (M12), and a control terminal (e.g., a gate terminal). The capacitor (C10) is coupled between the control terminal of the transistor (M12) and ground. The capacitor (C11) is coupled between the control terminal of the transistor (M13) and ground. The capacitor (C9) and the resistor (R3) are coupled in parallel between the second terminal of the transistor (M11) and ground.

In this embodiment, the impedance matching circuit 35 includes two inductors (Lo1, Lo2) and a capacitor (Co). The inductor (Lo1) has a first terminal that is used to receive a supply voltage (VCC4), and a second terminal that is coupled to the common node (O3) for receiving the second combined signal (Io2) therefrom. The capacitor (Co) has a first terminal that is coupled to the second terminal of the inductor (Lo1), and a second terminal. The inductor (Lo2) has a first terminal that is coupled to the second terminal of the capacitor (Co), and a second terminal that provides the output signal (OUT).

Referring back to FIG. 1, as a result, each of the first combined signal (Io1) and the output signal (OUT) is generated when the digital message signal (DIN) is at the logic high level, and is not generated when the digital message signal (DIN) is at the logic low level, thereby achieving on-off keying (OOK).

In one example, the fundamental frequency may be 96 GHz, the second harmonic frequency may be 192 GHz, the fourth harmonic frequency may be 384 GHz, the eighth harmonic frequency may be 768 GHz, and the digital message signal (DIN) may have a frequency of 4 GHz.

Figure 4:
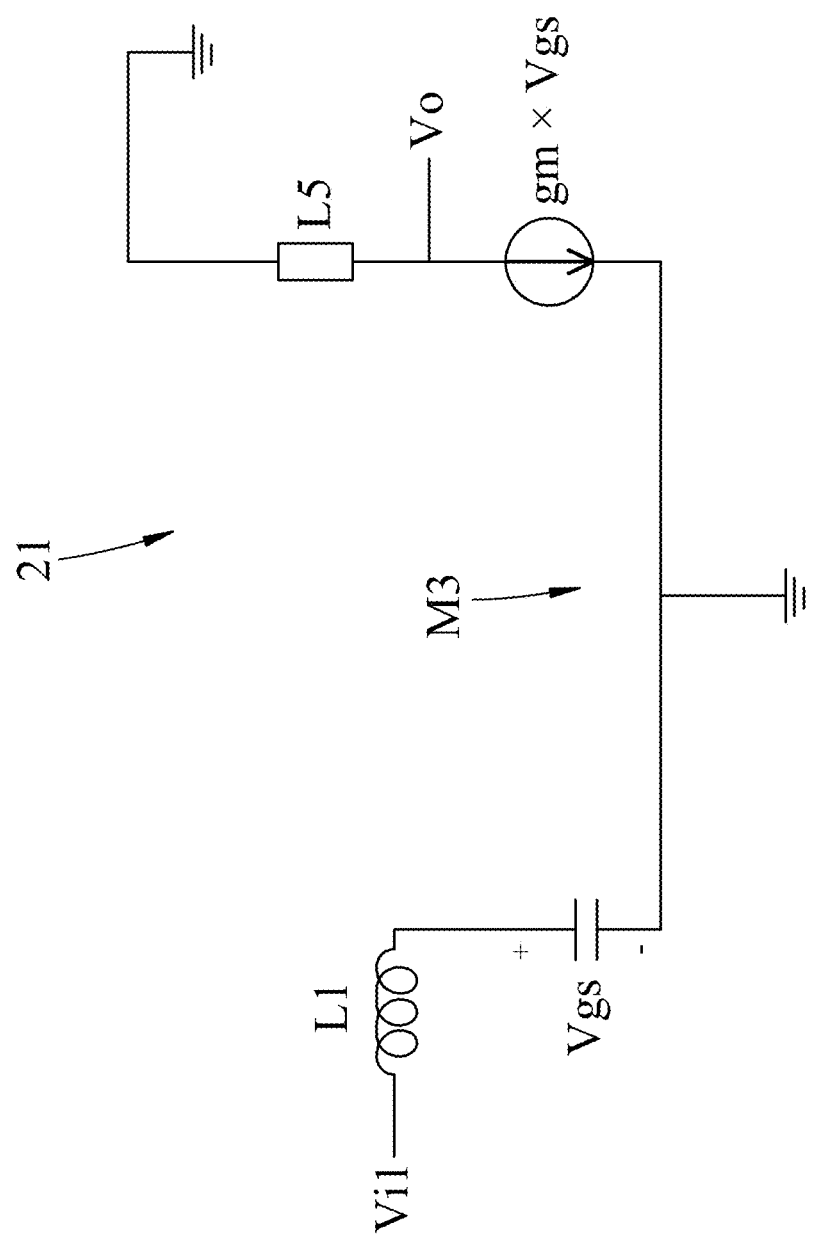
FIG. 4 is a circuit diagram illustrating a small signal equivalent circuit of a combination of a first inductor and a portion of a first amplifier circuit of the embodiment.

A small signal equivalent circuit of a combination of the first inductor (L1) and the transistor (M3) and the inductor (L5) of the first amplifier circuit 21 is depicted in FIG. 4. Referring to FIGS. 1 and 4, when the digital message signal (DIN) is at the logic high level, the combination of the first inductor (L1) and the transistor (M3) and the inductor (L5) of the first amplifier circuit 21 has again (Vo/Vi1) that can be expressed by the following equation:

$$\frac{Vo}{Vi1} = \frac{Vo}{Vgs} \cdot \frac{Vgs}{Vi1} = (-gm \cdot s \cdot l5) \cdot \left( \frac{\frac{1}{s \cdot cgs}}{\frac{1}{s \cdot cgs} + s \cdot l1} \right) = \frac{-gm \cdot s \cdot l5}{1 - \omega^2 \cdot l1 \cdot cgs},$$

where Vgs denotes a voltage provided between the control and second terminals of the transistor (M3), cgs denotes a parasitic capacitance provided between the control and second terminals of the transistor (M3), gm denotes a transconductance of the transistor (M3), l5 denotes an inductance of the inductor (L5), l1 denotes an inductance of the first inductor (L1), and ω denotes an angular frequency that corresponds to the second harmonic frequency of 2×f0 (i.e., ω=2π·(2·f0)). It is known from the above equation that the first inductor (L1) can enhance the gain of the combination of the first inductor (L1) and the transistor (M3) and the inductor (L5) of the first amplifier circuit 21 (and also a magnitude of the first amplified signal (I1)), which is apparent since (1−ω²·l1·cgs) is smaller than one. Similarly, when the digital message signal (DIN) is at the logic high level, the second inductor (L2) can enhance a gain of a combination of the second inductor (L2) and the transistor (M3) and the inductor (L5) of the second amplifier circuit 22 (and also a magnitude of the second amplified signal (I2)). Therefore, a magnitude of each of the first combined signal (Io1) and the output signal (OUT) and output power of each of the frequency doubling modulator 2 and the frequency doubler 3 can be increased.

Referring to FIGS. 1 and 3, similarly, when the digital message signal (DIN) is at the logic high level, the third inductor (Lg3) can enhance a gain of a combination of the third inductor (Lg3) and the third amplifier circuit 33 (and also a magnitude of the third amplified signal (I3)), and the fourth inductor (Lg4) can enhance a gain of a combination of the fourth inductor (Lg4) and the fourth amplifier circuit 34 (and also a magnitude of the fourth amplified signal (I4)). Therefore, the magnitude of the output signal (OUT) and the output power of the frequency doubler 3 can be increased.

Referring to FIGS. 1 to 3, in view of the above, the digital modulating device of this embodiment has the following advantages:

1. By virtue of the first to fourth inductors (L1-L4), when the digital message signal (DIN) is at the logic high level, the gain of each of the frequency doubling modulator 2 and the frequency doubler 3 can be enhanced to result in an increase in the output power of each of the frequency doubling modulator 2 and the frequency doubler 3.

2. Since the push-push circuit 12 does not include any transistor that consumes DC power, it has relatively low power consumption.

3. Since each of the first combined signal (Io1) and the output signal (OUT) is generated when the digital message signal (DIN) is at the logic high level, and is not generated when the digital message signal (DIN) is at the logic low level, OOK is achieved.

Figure 6:
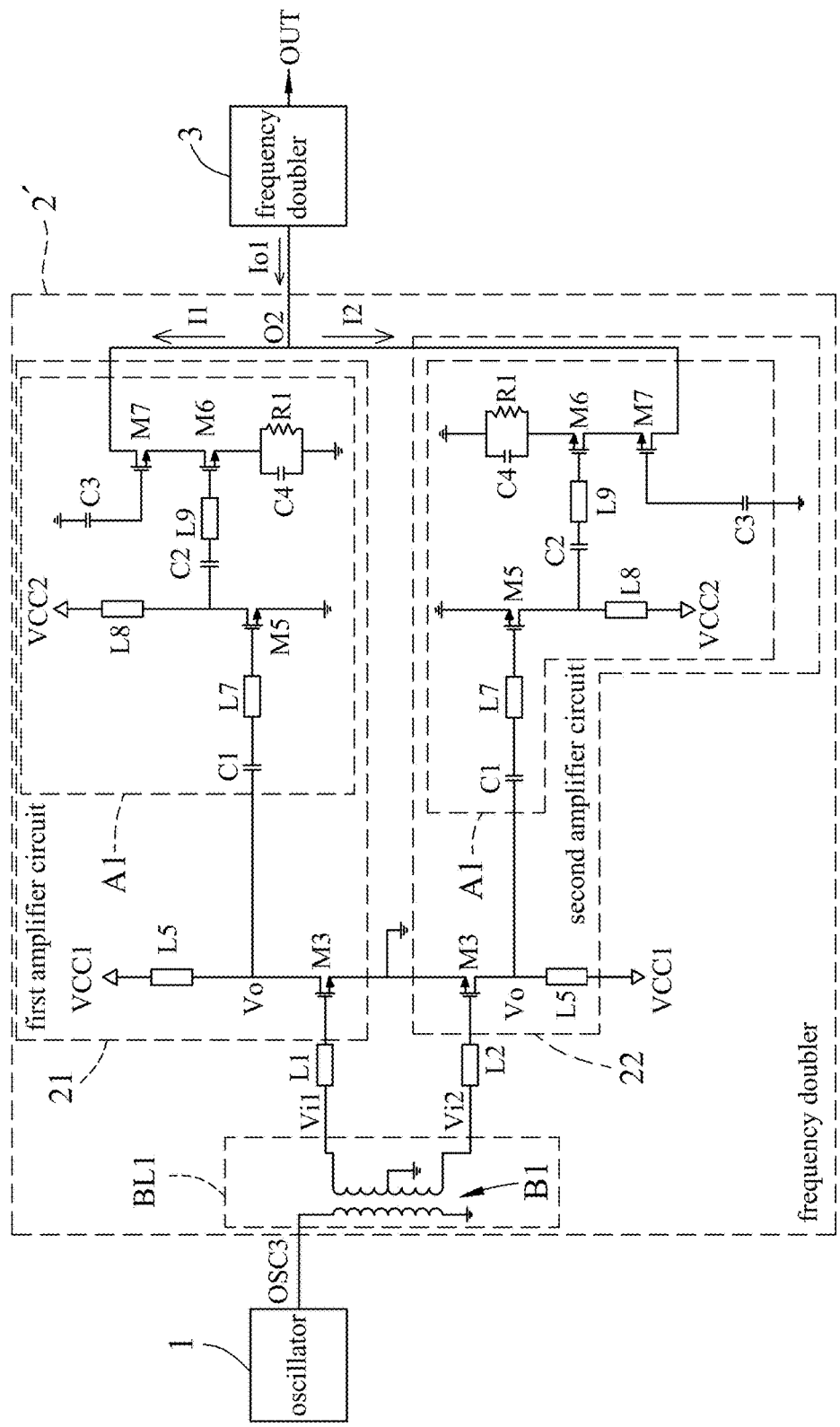
FIG. 6 is a circuit block diagram illustrating an embodiment of an oscillating device according to the disclosure.

Referring to FIG. 6, an embodiment of an oscillating device according to the disclosure is a modification of the embodiment of the digital modulating device, and differs from the embodiment of the digital modulating device in that the frequency doubling modulator 2 (see FIG. 1) is replaced by a frequency doubler 2'.

In the embodiment of the oscillating device, the frequency doubler 2' is similar to the frequency doubling modulator 2 (see FIG. 1), except that the switching circuit 23 (see FIG. 1) is omitted and that the second terminal of each transistor (M3) is grounded. As such, the generation of each intermediate signal (Vo) is not relevant to the digital message signal (DIN) (see FIG. 1), neither is the generation of each of the first combined signal (Io1) and the output signal (OUT), and therefore OOK is not achieved.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiments, it is understood that the disclosure is not limited to the disclosed embodiments but is intended to cover various arrangements included within the spirit and scope of the broadest interpretation so as to encompass all such modifications and equivalent arrangements.

What is claimed is:

1. A digital modulating device comprising:
   an oscillator generating an oscillation signal; and
   a frequency doubling modulator including
     a first single-ended to differential converter coupled to said oscillator for receiving the oscillation signal therefrom, and converting the oscillation signal into a first differential periodic signal pair that includes a first periodic signal and a second periodic signal,
     a first inductor having a first terminal that is coupled to said first single-ended to differential converter for receiving the first periodic signal therefrom, and a second terminal that provides a first input signal,
     a second inductor having a first terminal that is coupled to said first single-ended to differential converter for receiving the second periodic signal therefrom, and a second terminal that provides a second input signal,
     a switching circuit used to receive a digital message signal, and operable between a first state and a second state based on the digital message signal,
     a first amplifier circuit coupled to said second terminal of said first inductor for receiving the first input signal therefrom, and coupled further to said switching circuit, and
     a second amplifier circuit coupled to said second terminal of said second inductor for receiving the second input signal therefrom, and coupled further to said switching circuit and said first amplifier circuit,
     when said switching circuit operates in the first state, said first amplifier circuit amplifying the first input signal to generate a first amplified signal, said second amplifier circuit amplifying the second input signal to generate a second amplified signal, and the first and second amplified signals being combined at a common node of said first and second amplifier circuits into a first combined signal that has a frequency which is twice a frequency of the oscillation signal,
     when said switching circuit operates in the second state, each of said first and second amplifier circuits not performing amplification;
   said oscillator including
     an oscillation generator used to receive a control voltage, and generating a differential fundamental signal pair and a multi-harmonic signal based on the control voltage, the differential fundamental signal pair having a frequency which varies according to the control voltage, the multi-harmonic signal including a plurality of harmonics, each having a frequency that is a positive integer multiple of the frequency of the differential fundamental signal pair, and
     a push-push circuit coupled to said oscillation generator for receiving the multi-harmonic signal therefrom, and filtering the multi-harmonic signal to generate the oscillation signal, the frequency of which is twice the frequency of the differential fundamental signal pair.

2. The digital modulating device of claim 1, wherein the differential fundamental signal pair includes a first fundamental signal and a second fundamental signal, and said oscillation generator includes:
   a first transistor having a first terminal, a second terminal that is grounded, and a control terminal;
   a second transistor having a first terminal that is coupled to said control terminal of said first transistor, a second terminal that is grounded, and a control terminal that is coupled to said first terminal of said first transistor;

a resistor having a first terminal that is used to receive the control voltage, and a second terminal;

two varactors, each having a first terminal that is coupled to said second terminal of said resistor, a second terminal that is coupled to said first terminal of a respective one of said first and second transistors, and a capacitance that varies according to the control voltage;

a third inductor having a first terminal, and a second terminal that is coupled to said first terminal of said first transistor; and a fourth inductor coupled between said first terminal of said third inductor and said first terminal of said second transistor;

the first fundamental signal being provided at said first terminal of said first transistor, the second fundamental signal being provided at said first terminal of said second transistor, the multi-harmonic signal being provided at said first terminal of said third inductor.

3. The digital modulating device of claim 1, wherein said push-push circuit includes:

a transmission line having a first terminal that is used to receive a supply voltage, a second terminal that is coupled to said oscillation generator for receiving the multi-harmonic signal therefrom, and a length that substantially equals a quarter of a wavelength which corresponds to the frequency of the oscillation signal; and a capacitor having a first terminal that is coupled to said second terminal of said transmission line, and a second terminal that provides the oscillation signal.

4. The digital modulating device of claim 1, further comprising a frequency doubler that is coupled to said common node of said first and second amplifier circuits for receiving the first combined signal therefrom, and that generates, based on the first combined signal, an output signal having a frequency which is twice the frequency of the first combined signal.

5. The digital modulating device of claim 4, wherein said frequency doubler includes:

a second single-ended to differential converter coupled to said common node of said first and second amplifier circuits for receiving the first combined signal therefrom, and converting the first combined signal into a second differential periodic signal pair that includes a third periodic signal and a fourth periodic signal;

a third inductor having a first terminal that is coupled to said second single-ended to differential converter for receiving the third periodic signal therefrom, and a second terminal that provides a third input signal;

a fourth inductor having a first terminal that is coupled to said second single-ended to differential converter for receiving the fourth periodic signal therefrom, and a second terminal that provides a fourth input signal;

a third amplifier circuit coupled to said second terminal of said third inductor for receiving the third input signal therefrom, and amplifying the third input signal to generate a third amplified signal;

a fourth amplifier circuit coupled to said second terminal of said fourth inductor for receiving the fourth input signal therefrom, coupled further to said third amplifier circuit, and amplifying the fourth input signal to generate a fourth amplified signal;

the third and fourth amplified signals being combined at a common node of said third and fourth amplifier circuits into a second combined signal that has a frequency which is twice the frequency of the first combined signal; and an impedance matching circuit coupled to said common node of said third and fourth amplifier circuits for receiving the second combined signal therefrom, providing the output signal based on the second combined signal, and determining an output impedance seen into said frequency doubler.

6. The digital modulating device of claim 5, wherein said third amplifier circuit includes:

a first transistor having a first terminal, a second terminal, and a control terminal that is coupled to said second terminal of said third inductor for receiving the third input signal therefrom;

a second transistor having a first terminal, a second terminal that is coupled to said first terminal of said first transistor, and a control terminal;

a third transistor having a first terminal that is coupled to said common node of said third and fourth amplifier circuits and that provides the third amplified signal, a second terminal that is coupled to said first terminal of said second transistor, and a control terminal;

a first capacitor coupled between said control terminal of said second transistor and ground;

a second capacitor coupled between said control terminal of said third transistor and ground; and a third capacitor and a resistor coupled in parallel between said second terminal of said first transistor and ground.

7. The digital modulating device of claim 5, wherein said impedance matching circuit includes:

a fifth inductor having a first terminal that is used to receive a supply voltage, and a second terminal that is coupled to said common node of said third and fourth amplifier circuits for receiving the second combined signal therefrom;

a capacitor having a first terminal that is coupled to said second terminal of said fifth inductor, and a second terminal; and a sixth inductor having a first terminal that is coupled to said second terminal of said capacitor, and a second terminal that provides the output signal.

8. A digital modulating device comprising:

an oscillator generating an oscillation signal; and a frequency doubling modulator including a first single-ended to differential converter coupled to said oscillator for receiving the oscillation signal therefrom, and converting the oscillation signal into a first differential periodic signal pair that includes a first periodic signal and a second periodic signal, a first inductor having a first terminal that is coupled to said first single-ended to differential converter for receiving the first periodic signal therefrom, and a second terminal that provides a first input signal, a second inductor having a first terminal that is coupled to said first single-ended to differential converter for receiving the second periodic signal therefrom, and a second terminal that provides a second input signal, a switching circuit used to receive a digital message signal, and operable between a first state and a second state based on the digital message signal, a first amplifier circuit coupled to said second terminal of said first inductor for receiving the first input signal therefrom, and coupled further to said switching circuit, and a second amplifier circuit coupled to said second terminal of said second inductor for receiving the second input signal therefrom, and coupled further to said switching circuit and said first amplifier circuit, when said switching circuit operates in the first state, said first amplifier circuit amplifying the first input signal to generate a first amplified signal, said second amplifier circuit amplifying the second input signal to generate a second amplified signal, and the first and second amplified signals being combined at a common node of said first and second amplifier circuits into a first combined signal that has a frequency which is twice a frequency of the oscillation signal, when said switching circuit operates in the second state, each of said first and second amplifier circuits not performing amplification;

each of said first and second amplifier circuits includes:

a first transistor having a first terminal, a second terminal that is coupled to said switching circuit, and a control terminal that is coupled to said second terminal of a corresponding one of said first and second inductors for receiving the corresponding one of the first and second input signals therefrom;

a third inductor having a first terminal that is used to receive a first supply voltage, and a second terminal that is coupled to said first terminal of said first transistor;

an intermediate signal being provided at said first terminal of said first transistor when said switching circuit operates in the first state, and being not provided when said switching circuit operates in the second state; and an amplifier coupled to said first terminal of said first transistor for receiving the intermediate signal therefrom, coupled further to said common node of said first and second amplifier circuits, and amplifying the intermediate signal to generate the corresponding one of the first and second amplified signals at said common node of said first and second amplifier circuits.

9. The digital modulating device of claim 8, wherein for said first amplifier circuit, said amplifier includes:

a first capacitor having a first terminal that is coupled to said first terminal of said first transistor for receiving the intermediate signal therefrom, and a second terminal;

a fourth inductor having a first terminal that is coupled to said second terminal of said first capacitor, and a second terminal;

a second transistor having a first terminal, a second terminal that is grounded, and a control terminal that is coupled to said second terminal of said fourth inductor;

a fifth inductor having a first terminal that is used to receive a second supply voltage, and a second terminal that is coupled to said first terminal of said second transistor;

a second capacitor having a first terminal that is coupled to said first terminal of said second transistor, and a second terminal;

a sixth inductor having a first terminal that is coupled to said second terminal of said second capacitor, and a second terminal;

a third transistor having a first terminal, a second terminal, and a control terminal that is coupled to said second terminal of said sixth inductor;

a fourth transistor having a first terminal that is coupled to said common node of said first and second amplifier circuits and that provides the first amplified signal, a second terminal that is coupled to said first terminal of said third transistor, and a control terminal;

a third capacitor coupled between said control terminal of said fourth transistor and ground; and a fourth capacitor and a resistor coupled in parallel between said second terminal of said third transistor and ground.

10. The digital modulating device of claim 8, wherein said switching circuit includes:

a fourth inductor having a first terminal that is used to receive the digital message signal, and a second terminal;

a fifth inductor having a first terminal that is coupled to said second terminal of said fourth inductor, and a second terminal;

a resistor coupled between said second terminal of said fifth inductor and ground; and a switch having a first terminal that is coupled to said second terminal of said first transistor of each of said first and second amplifier circuits, a second terminal that is grounded, and a control terminal that is coupled to said second terminal of said fourth inductor, said switch conducting when said switching circuit operates in the first state, and not conducting when said switching circuit operates in the second state.

11. A frequency doubler comprising:

a first inductor having a first terminal that receives a first periodic signal, and a second terminal that provides a first input signal;

a second inductor having a first terminal that receives a second periodic signal, and a second terminal that provides a second input signal;

the first and second periodic signals cooperatively constituting a differential periodic signal pair;

a first amplifier circuit coupled to said second terminal of said first inductor for receiving the first input signal therefrom, and amplifying the first input signal to generate a first amplified signal; and a second amplifier circuit coupled to said second terminal of said second inductor for receiving the second input signal therefrom, coupled further to said first amplifier circuit, and amplifying the second input signal to generate a second amplified signal;

the first and second amplified signals being combined at a common node of said first and second amplifier circuits into a combined signal that has a frequency which is twice a frequency of the differential periodic signal pair;

wherein said first amplifier circuit includes a first transistor having a first terminal, a second terminal that is grounded, and a control terminal that is coupled to said second terminal of said first inductor for receiving the first input signal therefrom, a third inductor having a first terminal that is used to receive a first supply voltage, and a second terminal that is coupled to said first terminal of said first transistor, a first capacitor having a first terminal that is coupled to said first terminal of said first transistor, and a second terminal, a fourth inductor having a first terminal that is coupled to said second terminal of said first capacitor, and a second terminal, a second transistor having a first terminal, a second terminal that is grounded, and a control terminal that is coupled to said second terminal of said fourth inductor, a fifth inductor having a first terminal that is used to receive a second supply voltage, and a second terminal that is coupled to said first terminal of said second transistor, a second capacitor having a first terminal that is coupled to said first terminal of said second transistor, and a second terminal, a sixth inductor having a first terminal that is coupled to said second terminal of said second capacitor, and a second terminal, a third transistor having a first terminal, a second terminal, and a control terminal that is coupled to said second terminal of said sixth inductor, a fourth transistor having a first terminal that is coupled to said common node of said first and second amplifier circuits and that provides the first amplified signal, a second terminal that is coupled to said first terminal of said third transistor, and a control terminal, a third capacitor coupled between said control terminal of said fourth transistor and ground, and a fourth capacitor and a resistor coupled in parallel between said second terminal of said third transistor and ground.

\* \* \* \* \*